(12) United States Patent
Kikuchi (10) Patent No.: US 10,320,039 B2
(45) Date of Patent: Jun. 11, 2019

(54) SEMICONDUCTOR DEVICE, BATTERY MONITORING SYSTEM, AND METHOD OF MONITORING BATTERY

(71) Applicant: LAPIS SEMICONDUCTOR CO., LTD., Kanagawa (JP)

(72) Inventor: Hidekazu Kikuchi, Kanagawa (JP)

(73) Assignee: LAPIS SEMICONDUCTOR CO., LTD., Kanagawa (JP)

( * ) Notice: Subject to any disclaimer, the term of this patent is extended or adjusted under 35 U.S.C. 154(b) by 433 days.

(21) Appl. No.: 14/798,654

(22) Filed: Jul. 14, 2015

(65) Prior Publication Data

US 2016/0018474 A1 Jan. 21, 2016

(30) Foreign Application Priority Data

Jul. 15, 2014 (JP) ................................ 2014-145250

(51) Int. Cl.
| | |
|---|---|
| *H02J 7/00* | (2006.01) |
| *H02J 7/14* | (2006.01) |
| *H01M 10/48* | (2006.01) |
| *H01M 10/44* | (2006.01) |
| *G01R 31/3835* | (2019.01) |

(52) U.S. Cl.
CPC ....... *H01M 10/486* (2013.01); *H01M 10/443* (2013.01); *H01M 10/48* (2013.01); *G01R 31/3835* (2019.01); *H01M 10/441* (2013.01); *H02J 7/0031* (2013.01); *H02J 7/0047* (2013.01); *H02J 7/0091* (2013.01)

(58) Field of Classification Search
USPC .............. 324/431, 434, 429, 433, 426, 430; 320/134, 162, 150, 132, 136, 137, 152
See application file for complete search history.

(56) References Cited

U.S. PATENT DOCUMENTS

| 7,173,429 B2* | 2/2007 | Kutkut | G01R 31/3648 324/431 |
|---|---|---|---|
| 2008/0036425 A1* | 2/2008 | Tashiro | H01M 10/486 320/154 |
| 2008/0122400 A1* | 5/2008 | Kubota | H02J 7/0004 320/106 |
| 2008/0238356 A1* | 10/2008 | Batson | H02J 7/0045 320/103 |
| 2010/0188048 A1* | 7/2010 | Nishino | H01M 2/166 320/120 |

(Continued)

FOREIGN PATENT DOCUMENTS

| JP | 2005-274372 A | 10/2005 |
|---|---|---|
| JP | 2008-111761 A | 5/2008 |

*Primary Examiner* — Alexis B Pacheco
(74) *Attorney, Agent, or Firm* — Kubotera & Associates, LLC (57) ABSTRACT

A semiconductor device includes a voltage generation circuit configured to generate a specific voltage; a first terminal configured to output the specific voltage; a second terminal configured to receive a temperature sensitive voltage; an analog/digital conversion circuit configured to convert the specific voltage and the temperature sensitive voltage to digital values; a storage unit configured to store the specific voltage and the temperature sensitive voltage; and a third terminal configured to transmit the specific voltage and the temperature sensitive voltage to an external semiconductor device.

8 Claims, 4 Drawing Sheets

(56) References Cited

U.S. PATENT DOCUMENTS

| | | | |
|---|---|---|---|
| 2010/0188050 A1* | 7/2010 | Asakura | G01R 31/025 320/136 |
| 2013/0175994 A1* | 7/2013 | Endo | H01M 10/48 320/116 |
| 2013/0234658 A1* | 9/2013 | Endo | H04B 5/0037 320/108 |

* cited by examiner

SEMICONDUCTOR DEVICE, BATTERY MONITORING SYSTEM, AND METHOD OF MONITORING BATTERY

BACKGROUND OF THE INVENTION AND RELATED ART STATEMENT

The present invention relates to a semiconductor device, a battery monitoring system, and a method of monitoring a battery. In particular, the present invention relates to a semiconductor device including a temperature measurement circuit for monitoring a battery, a battery monitoring system using the semiconductor device, and a method of monitoring a battery using the semiconductor device.

In recent years, a conventional semiconductor device having a temperature measurement circuit has been used in a wide range of applications. Such a conventional semiconductor device includes a battery monitoring IC (Integrated Circuit). The battery monitoring IC is configured to monitor a voltage and the like generated in a charging device of a secondary battery as well as a temperature of the secondary battery. Accordingly, it is possible to control charging of the secondary battery according to the temperature thereof.

Patent Reference 1 has disclosed such a conventional battery monitoring IC. The conventional battery monitoring IC disclosed in Patent Reference 1 is formed of a micro computer (MPU: Micro Processing Unit) having a standard power source disposed therein for generating a standard voltage to be used for an analog-digital conversion (A/D). The MPU is configured to be driven by an external input power source. Further, the MPU is configured to receive a temperature detection voltage V1 from a thermistor connected to a voltage dividing resistor and a reference voltage V2 obtained through dividing a power source voltage of the external input power source with the voltage dividing resistor. Further, the MPU is configured to convert the temperature detection voltage V1 to a voltage ADV1 and the reference voltage V2 to a voltage ADV2 through the A/D conversion.

Patent Reference 1: Japanese Patent Publication No. 2008-111761

In the conventional battery monitoring IC disclosed in Patent Reference 1, a comparison circuit calculates a division result of the voltage ADV1 and the voltage ADV2 (ADV1/ADV2), which is represented by a resistivity value of the thermistor and a resistivity value of the voltage dividing resistor. Accordingly, when the MPU calculates the division result with the resistivity value of the thermistor, it is possible to obtain the resistivity value of the thermistor. In the next step, after the MPU converts the resistivity value of the thermistor to the temperature, it is possible to detect the temperature. The conventional battery monitoring IC disclosed in Patent Reference 1 has such a configuration described above, so that it is not necessary to stabilize the external input power source.

Patent Reference 2 has disclosed a conventional temperature measurement circuit. The conventional temperature measurement circuit disclosed in Patent Reference 2 is formed of a power source circuit, a microcomputer, and a temperature sensitive resistor element circuit. The temperature sensitive resistor element circuit is formed of a series circuit of a thermistor and a voltage dividing resistor. The power source circuit applies a power source voltage as an input voltage to the thermistor. The input voltage and an output voltage as a voltage at a connection point between the thermistor and the voltage dividing resistor are input into the microcomputer, so that an A/D converter converts the input voltage and the output voltage into digital values.

Patent Reference 2: Japanese Patent Publication No. 2005-274372

In the conventional temperature measurement circuit disclosed in Patent Reference 2, the micro computer stores a table indicating a relationship between the input voltage and the output voltage thus digitally converted, and a temperature detection data. Accordingly, when the microcomputer refers to the table, it is possible to measure the temperature. When the conventional temperature measurement circuit has the configuration disclosed in Patent Reference 2, it is possible to measure the temperature compensated according to a change in the power source voltage.

In the conventional battery monitoring IC disclosed in Patent Reference 1, and the conventional temperature measurement circuit disclosed in Patent Reference 2, the main configuration is formed of the semiconductor device having the calculation function, the comparison function, and the like realized with the MPU, the microcomputer, and the like. Accordingly, the semiconductor device has the function of measuring a temperature as a supplemental function.

In other words, according to the conventional battery monitoring IC disclosed in Patent Reference 1 and the conventional temperature measurement circuit disclosed in Patent Reference 2, the conventional semiconductor device is capable of performing a calculation as the primary function. In the semiconductor device, it is possible to easily perform a relatively complex calculation. Further, it is possible to easily store a table with a large capacity according to various conditions. As a result, it is possible to easily achieve the temperature measurement circuit capable of suppressing an influence of a variance in the power source voltage.

On the other hand, when the semiconductor device has only a limited function such as a function of monitoring a battery, it is necessary to minimize a circuit scale as much as possible. Accordingly, it is difficult to provide a calculation circuit, a comparison circuit, or a memory with a large capacity.

Further, when the semiconductor device includes the A/D conversion circuit, the A/D conversion circuit tends to increase a circuit scale thereof for accurately measuring a temperature and a voltage. Accordingly, an area of the A/D conversion circuit to be disposed in the semiconductor device tends to increase as well. For the reason, it is not desirable to dispose a plurality of A/D conversion circuits in the conventional semiconductor device as disclosed in Patent Reference 1. In the conventional semiconductor device, however, it is still necessary to secure a certain accuracy of the temperature measurement. In particular, it is necessary to reduce a measurement error of a temperature due to the variance in the power source voltage applied to the thermistor as much as possible.

As a summary, when the conventional semiconductor device does not have the calculation function like those of the conventional semiconductor devices disclosed in Patent References 1 and 2, such a conventional semiconductor device is configured to be limited to the simple function of monitoring the battery, so that the circuit scale and the cost thereof are restricted. Accordingly, in the conventional semiconductor device with the simple function, it is difficult to obtain the temperature measurement circuit capable of achieving accuracy comparable to that of the conventional semiconductor devices disclosed in Patent References 1 and 2.

In view of the problems of the conventional semiconductor devices described above, a subject of the present invention is to provide a semiconductor device having a temperature measurement circuit with a simple configuration capable of measuring a temperature with high accuracy. Another object of the present invention is to provide a battery monitoring system using the semiconductor device, and a method of monitoring a battery using the semiconductor device.

Further objects and advantages of the invention will be apparent from the following description of the invention.

SUMMARY OF THE INVENTION

In order to attain the objects described above, according to a first aspect of the present invention, a semiconductor device includes a voltage generation circuit; a first terminal; a second terminal; a third terminal; an analog/digital conversion circuit; and a storage unit. In the semiconductor device, the voltage generation circuit is configured to generate a voltage having a specific voltage value. The first terminal is configured to output the voltage generated with the voltage generation circuit. The second terminal is connected to the first terminal. Further, the second terminal is configured to receive a temperature sensitive voltage as a voltage at a connecting point between a temperature sensitive element and a resistor of a circuit for detecting a temperature of a subject, in which the temperature sensitive element is connected to the resistor in series.

According to the first aspect of the present invention, in the semiconductor device, the analog/digital conversion circuit is configured to convert the specific voltage value and a voltage value of the temperature sensitive voltage that are analog values to digital values, respectively, so that the specific voltage value and the temperature sensitive voltage are measured. The storage unit is configured to store the specific voltage value and the voltage value of the temperature sensitive voltage thus measured with the analog/digital conversion circuit, so that an external semiconductor device calculates the temperature of the subject. The third terminal is configured to transmit the specific voltage value and the voltage value of the temperature sensitive voltage thus stored in the storage unit to the external semiconductor device.

According to a second aspect of the present invention, a battery monitoring system includes the semiconductor device and the external semiconductor device in the first aspect. In the semiconductor device, the subject is a rechargeable battery as a monitoring subject. The external semiconductor device is configured to retrieve the specific voltage value and the voltage value of the temperature sensitive voltage stored in the storage unit through the third terminal. Further, the external semiconductor device is configured as a calculation device to calculate the temperature of the rechargeable battery according to a specific equation with the specific voltage value and the voltage value of the temperature sensitive voltage as variables.

According to a third aspect of the present invention, a method of monitoring a battery uses a battery monitoring semiconductor device. The battery monitoring semiconductor device includes a voltage generation circuit; a first terminal; a second terminal; a third terminal; an analog/digital conversion circuit; and a storage unit. In the semiconductor device, the voltage generation circuit is configured to generate a voltage having a specific voltage value. The second terminal is configured to output the voltage generated with the voltage generation circuit. The second terminal is connected to the first terminal. Further, the second terminal is configured to receive a temperature sensitive voltage as a voltage at a connecting point between a temperature sensitive element and a resistor of a circuit for detecting a temperature of a subject, in which the temperature sensitive element is connected to the resistor in series.

According to the third aspect of the present invention, in the battery monitoring semiconductor device, the analog/digital conversion circuit is configured to convert the specific voltage value and a voltage value of the temperature sensitive voltage that are analog values to digital values, respectively, so that the specific voltage value and the temperature sensitive voltage are measured. The storage unit is configured to store the specific voltage value and the voltage value of the temperature sensitive voltage thus measured with the analog/digital conversion circuit, so that an external semiconductor device calculates the temperature of the subject. The third terminal is configured to transmit the specific voltage value and the voltage value of the temperature sensitive voltage thus stored in the storage unit to the external semiconductor device.

According to the third aspect of the present invention, the battery monitoring semiconductor device is connected to the external semiconductor device. The external semiconductor device is configured to retrieve the specific voltage value and the voltage value of the temperature sensitive voltage stored in the storage unit through the third terminal. Further, the external semiconductor device is configured as a calculation device to calculate the temperature of the rechargeable battery according to a specific equation with the specific voltage value and the voltage value of the temperature sensitive voltage as variables.

According to the present invention, it is possible to provide the semiconductor device having a temperature measurement circuit with a simple configuration capable of measuring the temperature with high accuracy. Further, it is possible to provide the battery monitoring system using the semiconductor device, and the method of monitoring the battery using the semiconductor device.

DETAILED DESCRIPTION OF PREFERRED EMBODIMENTS

Hereunder, preferred embodiments of the present invention will be explained with reference to the accompanying drawings. In the following description, the present invention is applied to a battery monitoring IC (Integrated Circuit) as a semiconductor device.

In the following preferred embodiments, the battery monitoring IC is configured to detect and monitor a voltage, a temperature, and the like of a secondary battery (also refer to as a battery) as a monitoring subject. Further, the battery monitoring IC is connected to an external semiconductor device such as an MPU (Micro Processing Unit) to constitute a battery monitoring system. It should be noted that the battery monitoring IC is configured to detect and monitor a voltage, a temperature, and the like as information for properly controlling charging of the secondary battery.

First Embodiment

Figure 1:
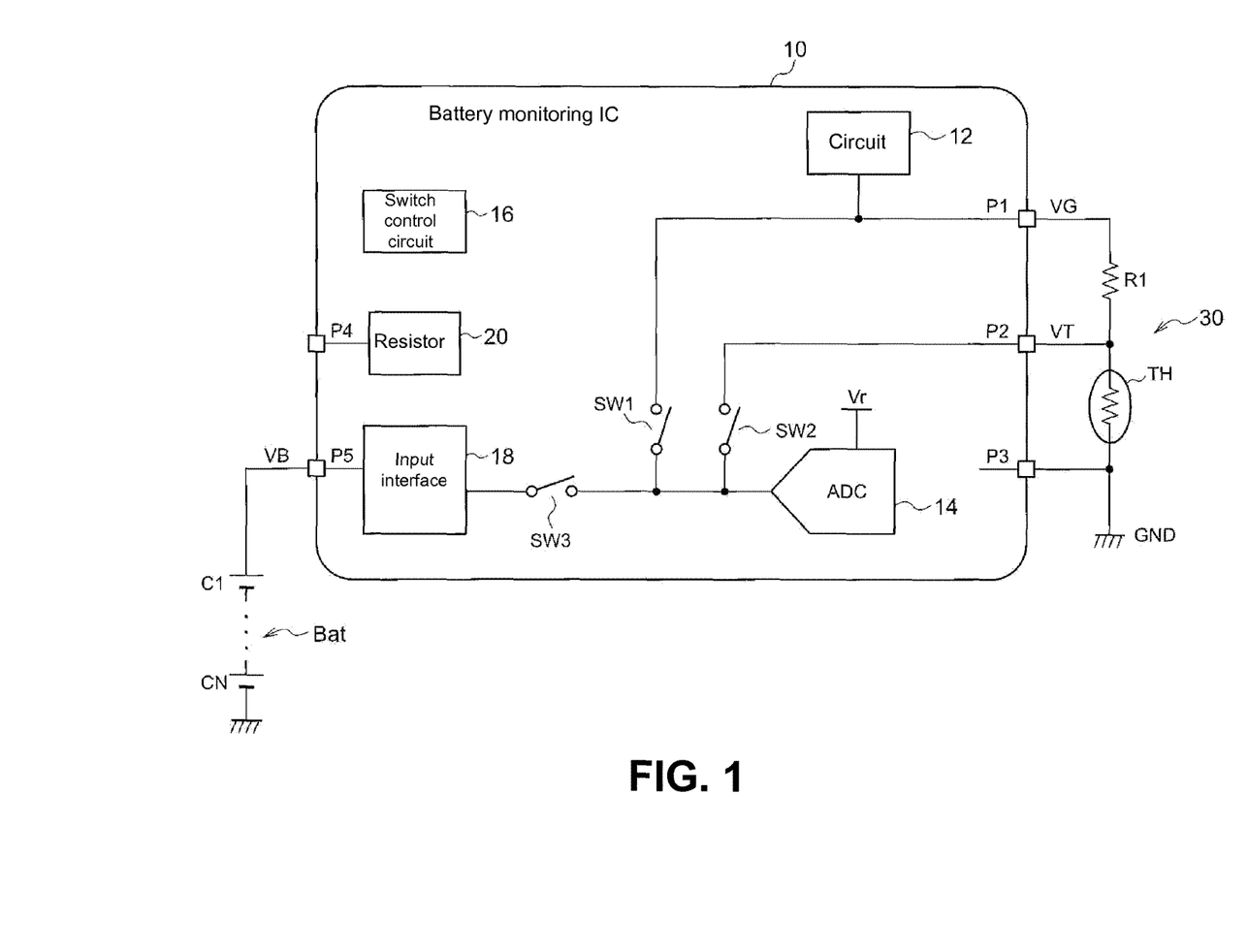
FIG. 1 is a block diagram showing a functional configuration of a battery monitoring IC (Integrated Circuit) according to a first embodiment of the present invention.

A first embodiment of the present invention will be explained. FIG. 1 is a block diagram showing a functional configuration of a battery monitoring IC (Integrated Circuit) 10 according to the first embodiment of the present invention.

As shown in FIG. 1, in the first embodiment, the battery monitoring IC 10 includes a voltage generation circuit 12; an analog/digital conversion circuit (ADC) 14; a switch control circuit 16; an input interface 18; a resistor 20; and switches SW1 to SW3.

In the first embodiment, an external circuit 30 is connected between a terminal P1 and a terminal P3 of the battery monitoring IC 10. The external circuit 30 is formed of a voltage dividing resistor R1 and a thermistor TH connected in series each other. A terminal P3 of the battery monitoring IC 10 is connected to one side of the thermistor TH opposite to the other side thereof connected to the voltage dividing resistor R1, and the terminal P3 is connected to ground.

In the first embodiment, a battery Bat as the monitoring subject is connected to a terminal P5 of the battery monitoring IC 10. The battery Bat is formed of a plurality of cells as constituting unit thereof connected in series. More specifically, the battery Bat is formed of N-number of the cells C1 to CN connected in series. Each of the cells C1 to CN has a voltage between, for example, 1.0 V and 4.3 V. As an example, in the first embodiment, the battery Bat is formed of sixteen of the cells (that is, N=16). Accordingly, a voltage of approximately 80 V at most is applied to the terminal P5 of the battery monitoring IC 10.

In the first embodiment, the thermistor TH is one of temperature sensitive elements for detecting a temperature. When a temperature surrounding the thermistor TH is changed, a resistivity of the thermistor TH changes, so that the thermistor TH is capable of detecting a temperature. More specifically, the thermistor TH has two characteristics. One of the characteristics is called a negative temperature coefficient (NTC) characteristic, in which a temperature surrounding the thermistor TH increases, a resistivity of the thermistor TH decreases. Another one of the characteristics is called a positive temperature coefficient (PTC) characteristic, in which a temperature surrounding the thermistor TH increases, a resistivity of the thermistor TH increases. In the first embodiment, it is possible to use the thermistor TH having either of the characteristics.

In the first embodiment, the thermistor TH is disposed to contact with the battery Bat. Alternatively, the thermistor TH may be disposed near the battery Bat. Further, the thermistor TH is disposed to each of the cells C1 to CN of the battery Bat. Alternatively, the cells C1 to CN of the battery Bat may be divided into several groups, and the thermistor TH may be disposed to each of the groups of the cells C1 to CN of the battery Bat.

In the first embodiment, the voltage generation circuit 12 is a circuit configured to generate primarily a source voltage VG to be supplied to the external circuit 30. When the voltage generation circuit 12 generates the source voltage VG, the voltage generation circuit 12 outputs the source voltage VG from the terminal P1 of the battery monitoring IC 10.

In the first embodiment, the voltage generation circuit 12 may be configured to generate a specific voltage independently inside the battery monitoring IC 10. Alternatively, the voltage generation circuit 12 may be configured to generate a specific voltage according to a voltage supplied externally. In the first embodiment, as an example, the voltage generation circuit 12 is configured to generate the source voltage VG through decreasing the voltage of the battery Bat as the monitoring subject of the battery monitoring IC 10. In an actual case, the source voltage VG may have a voltage value of, for example, 5.0 V.

In the first embodiment, when the source voltage VG is applied to the external circuit 30, the source voltage VG is divided with the voltage dividing resistor R1 and the thermistor TH, so that a thermistor voltage VT is generated at a connecting point between the voltage dividing resistor R1 and the thermistor TH. After the thermistor voltage VT is generated, the thermistor voltage VT is input into inside the battery monitoring IC 10 through the terminal P2, so that the thermistor voltage VT is applied to the ADC 14 through the switch SW2.

In the first embodiment, the ADC 14 is an electrical circuitry that converts an analog value such as the source voltage VG, the thermistor voltage VT, and a voltage VB of the battery Bat to a digital value according to a reference voltage Vr. Further, the ADC 14 has a function of measuring the source voltage VG, the thermistor voltage VT, and the voltage VB of the battery Bat.

In the first embodiment, a bit number of the digital value is not limited to any specific one. As an example, the digital value may be 12 bit. Further, the reference voltage Vr may be, for example, 5.0 V. When the reference voltage Vr is 5.0 V, an accuracy of the voltage converted to the digital value is approximately 1.2 mV (5,000 mV/4096). The reference voltage Vr may be generated according to the voltage generated with the voltage generation circuit 12. As described above, when the ADC 14 has such high accuracy, a circuitry scale thereof tends to increase, thereby increasing an occupied area thereof in the semiconductor device. Accordingly, in the first embodiment, the battery monitoring IC 10 includes only one ADC 14. It should be noted that a conventional method may be adopted for converting the analog value to the digital value using the reference voltage, and an explanation thereof is omitted.

In the first embodiment, the switches SW1, SW2, and SW3 are provided for connecting the ADC 14 to a voltage to be a measurement subject one to one when the source voltage VG, the thermistor voltage VT, and the voltage VB of the battery Bat are measured.

In the first embodiment, the switch control circuit 16 is an electrical circuitry for controlling on/off of the switches SW1, SW2, and SW3, so that the source voltage VG, the thermistor voltage VT, and the voltage VB of the battery Bat are measured. More specifically, when the source voltage VG is measured, the switch control circuit 16 controls the switch SW1 to be turned on, and the switches SW2 and SW3 to be turned off. When the thermistor voltage VT is measured, the switch control circuit 16 controls the switch SW2 to be turned on, and the switches SW1 and SW3 to be turned off. When the voltage VB of the battery Bat is measured, the switch control circuit 16 controls the switch SW3 to be turned on, and the switches SW1 and SW2 to be turned off.

In the first embodiment, the input interface 18 is an interface circuitry for inputting the voltage VB of the battery Bat connected to the terminal P5 of the battery monitoring IC 10. It should be noted that the input interface 18 is composed of a buffer circuit and the like (not shown).

In the first embodiment, the resistor 20 is a resistor for storing the measurement values of the source voltage VG, the thermistor voltage VT, and the voltage VB of the battery Bat thus measured as described above. After the measurement values of the source voltage VG, the thermistor voltage VT, and the voltage VB of the battery Bat are stored in the resistor 20, it is possible to retrieve the measurement values from the external semiconductor device such as the MPU and the like connected to the battery monitoring IC 10 and constituting the battery monitoring system as a whole through specifying an address thereof.

In the first embodiment, after the MPU retrieves the source voltage VG and the thermistor voltage VT thus measured as described above from the resistor 20, the MPU is capable of calculating a temperature TB of the battery Bat through inputting the source voltage VG and the thermistor voltage VT into the following equation (1):

$$TB = \frac{1}{\dfrac{\text{Log}\left\{\dfrac{R1}{\left(\dfrac{VG}{VT}-1\right) \cdot R0}\right\}}{B} + \dfrac{1}{298}} \quad (1)$$

where Log is a natural logarithm; R1 is the resistivity value of the voltage dividing resistor R1; VG is the source voltage; VT is the thermistor voltage; R0 is the resistivity value of the thermistor TH at a normal temperature (25° C.); and B is a B coefficient of the thermistor TH. Further, the number "298" in the equation (1) is an absolute temperature converted from the normal temperature (25° C.).

In the equation (1), the thermistor voltage VT is the only variable depending on a temperature. Accordingly, it is possible to calculate a temperature surrounding the thermistor TH (corresponding to the temperature TB of the battery Bat) through obtaining the thermistor voltage VT.

In the first embodiment, when the source voltage VG and the thermistor voltage VT are input into the battery monitoring IC 10, as described later, it is possible to accurately measure the temperature TB of the battery Bat with minimizing an influence of a variance error of the source voltage VG.

In the first embodiment, the source voltage VG and the thermistor voltage VT are measured at a measurement timing not limited to any specific one. In consideration of a rapid voltage fluctuation of the source voltage VG, it is preferred to measure the source voltage VG and VT at measurement timings with a small interval as possible. It should be noted that the measurement of the source voltage VG and the thermistor voltage VT is not limited to any specific order (either one may be measured first). Further, the voltage VB of the battery Bat is not directly related to the measurement of the temperature TB of the battery Bat. Accordingly, the voltage VB of the battery Bat may be measured at any arbitrary timing during an operation of the battery monitoring system as a whole.

As described above, in the first embodiment, the battery monitoring IC 10 has the simple configuration specialized in the function of measuring the temperature of the battery Bat, and does not include the calculation processing function of the MPU and the like. It should be noted that the battery monitoring IC 10 may include a limited function of monitoring a cell balance (monitoring a variance in discharging capacity per cell C)) and the like.

Figure 3:
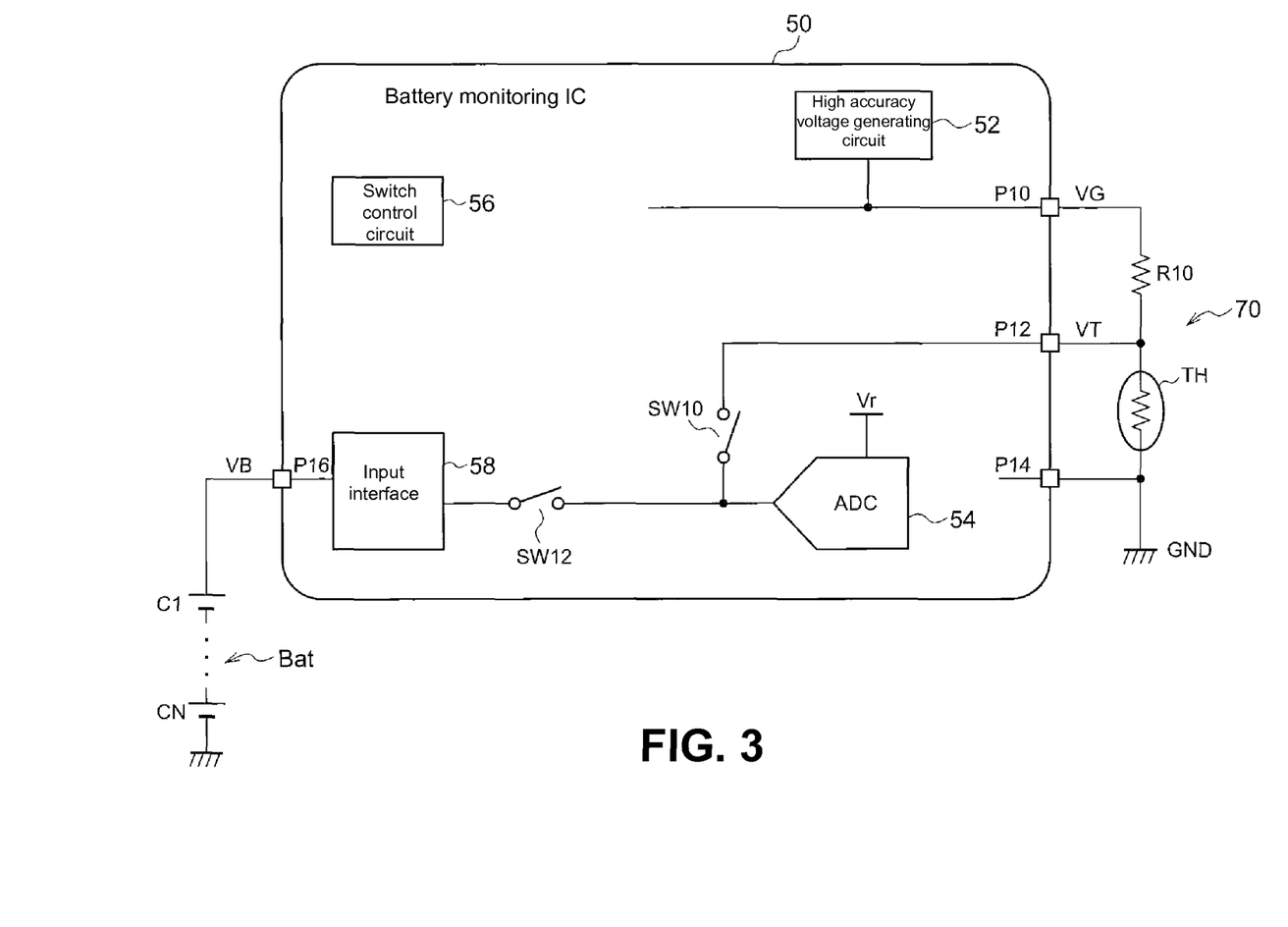
FIG. 3 is a block diagram showing a functional configuration of a battery monitoring IC (Integrated Circuit) according to a comparative example.

A comparative example will be explained next with reference to FIG. 3. FIG. 3 is a block diagram showing a functional configuration of a battery monitoring IC (Integrated Circuit) 50 according to the comparative example.

As shown in FIG. 3, the battery monitoring IC 50 includes a high accuracy voltage generation circuit 52; an ADC 54; a switch control circuit 56; and an input interface 58. It should be noted that the high accuracy voltage generation circuit 52, the ADC 54, the switch control circuit 56 and the input interface 58 respectively have functions similar to those of the voltage generation circuit 12, the ADC 14, the switch control circuit 16, and the input interface 18 of the battery monitoring IC 10. However, for the reason described later, the high accuracy voltage generation circuit 52 is configured to generate a voltage with higher accuracy than that of the voltage generation circuit 12.

In the comparative example, the high accuracy voltage generation circuit 52 is configured to generate the source voltage VG, so that the source voltage VG is output from a terminal P10. The voltage VB of the battery Bat as a monitoring subject of the battery monitoring IC 50 is applied inside the battery monitoring IC 50 from a terminal P16 through the input interface 58.

As shown in FIG. 3, an external circuit 70 is connected between the terminal P10 and a terminal P14 of the battery monitoring IC 50. The external circuit 70 is formed of a voltage dividing resistor R10 and the thermistor TH connected in series each other. Further, the thermistor voltage VT is generated at a connecting point between the voltage dividing resistor R10 and the thermistor TH. After the thermistor voltage VT is generated, the thermistor voltage VT is input into inside the battery monitoring IC 50 through a terminal P12.

In the comparative example, the battery monitoring IC 50 is provided with switches SW10 and SW12. The switch control circuit 56 is configured to control each of the switches SW10 and SW12, so that the ADC 54 measures the thermistor voltage VT and the voltage VB of the battery Bat. It should be noted that the battery monitoring IC 50 in the comparative example is differ in not measuring the source voltage VG from the battery monitoring IC 10 in the first embodiment of the present invention.

In the comparative example, similar to the battery monitoring IC 10 in the first embodiment of the present invention, the battery monitoring IC 50 is configured to calculate the temperature surrounding the thermistor TH (corresponding to the temperature TB of the battery Bat) according to the equation (1). In other words, the ADC 54 is configured to convert the thermistor voltage VT into the digital value, and the battery monitoring IC 50 is configured to input the digital value of the thermistor voltage VT into the equation (1), thereby calculating the temperature TB of the battery Bat.

As described above, the battery monitoring IC 50 is not configured to measure the source voltage VG as the parameter of the temperature measurement, so that the battery monitoring IC 50 does not input the source voltage VG into the equation (1). In other words, as the source voltage VG, the battery monitoring IC 50 uses a specific fixed value determined in advance according to specification of the battery monitoring IC 50 and the like. Accordingly, in the equation (1), a variance in the source voltage VG (a voltage fluctuation) may be added to an error of the temperature to be measured.

For example, if the source voltage VG is shifted from an expected value by few hundred mV, the calculation result of the temperature TB of the battery Bat can be deviated by a few ° C. For this reason, in consideration of the accuracy of the temperature measurement, it is necessary to provide the high accuracy voltage generation circuit 52 with higher accuracy than that of the voltage generation circuit 12.

However, in general, the high accuracy voltage generation circuit 52 tends to have a large circuit scale and a higher cost. Accordingly, it is difficult to adopt the high accuracy voltage generation circuit 52 to the battery monitoring IC 10 in the first embodiment of the present invention, that has the limited function and can be low cost.

As described above, according to the conventional battery monitoring IC disclosed in Patent Reference 1 and the conventional temperature measurement circuit disclosed in Patent Reference 2, the conventional semiconductor device is capable of performing a calculation as the primary function. In the conventional semiconductor device, it is possible to cancel the fluctuation of the power source voltage using the comparison function, the calculation function, and the storage function. On the other hand, when the semiconductor device has only a limited function such as a function of monitoring a battery, it is difficult to provide a calculation circuit, a comparison circuit, or a memory with a large capacity like the conventional battery monitoring IC disclosed in Patent Reference 1 and the conventional temperature measurement circuit disclosed in Patent Reference 2.

In the first embodiment of the present invention, as described above, the battery monitoring IC 10 includes the switch SW1, so that the source voltage VG is measured. Further, in addition to the thermistor voltage VT, the source voltage VG is input into the equation (1), so that the temperature TB of the battery Bat is calculated. When the actual measurement value of the source voltage VG is used in calculating the temperature TB of the battery Bat, the error associated with the fluctuation of the source voltage VG upon measuring thermistor voltage VT is cancelled out. Accordingly, it is possible to accurately measure the temperature TB of the battery Bat. In other words, in the battery monitoring IC 10 in the first embodiment, it is not necessary to provide the high accuracy voltage generation circuit 52 like the battery monitoring IC 50 in the comparative example.

In the first embodiment, the battery monitoring IC 10 does not have the calculation function or the memory for storing a table. Accordingly, after the ADC 14 measures the source voltage VG and the thermistor voltage VT, the actual measurement values thereof (the digital values) are stored in the resistor 20.

In the first embodiment, the MPU is configured to collectively control the battery monitoring system as a whole. In particular, the MPU specifies the address of the resistor 20 to retrieve the measurement values of the source voltage VG and the thermistor voltage VT. In the next step, the MPU performs the calculation function to calculate the temperature TB of the battery Bat from the equation (1).

As described above, in the battery monitoring IC 10 in the first embodiment, in addition to the measurement value of the thermistor voltage VT, the measurement value of the source voltage VG is stored in the resistor 20. Then, the MPU externally connected to the battery monitoring IC 10 calculates the temperature TB of the battery Bat using the source voltage VG and the thermistor voltage VT. Accordingly, it is possible to provide the battery monitoring IC 10 as the semiconductor device, the battery monitoring system having the semiconductor device, and the method of monitoring the battery Bat capable of accurately measuring the temperature of the battery Bat with the simple configuration.

Second Embodiment

Figure 2:
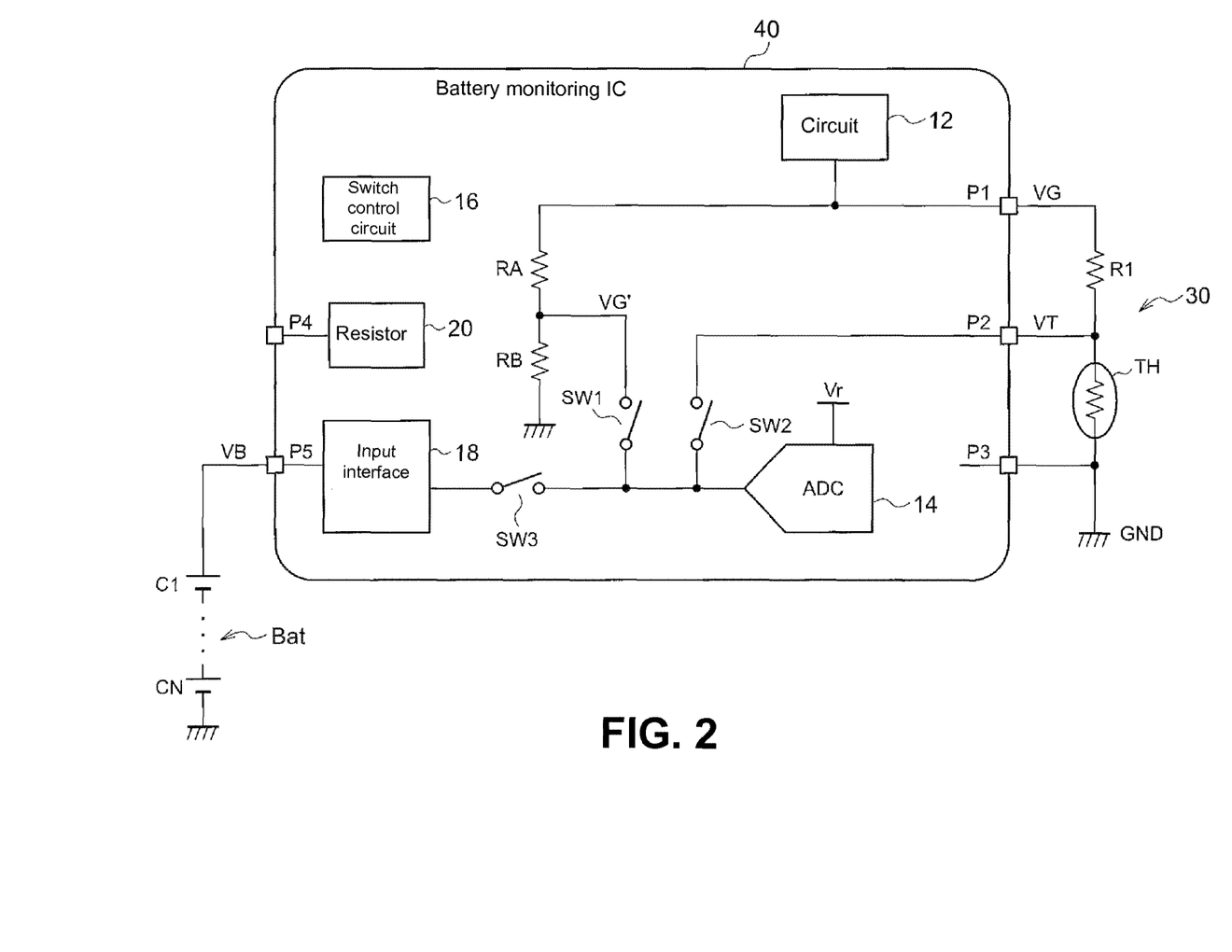
FIG. 2 is a block diagram showing a functional configuration of a battery monitoring IC (Integrated Circuit) according to a second embodiment of the present invention.

A second embodiment of the present invention will be explained next with reference to FIG. 2. FIG. 2 is a block diagram showing a functional configuration of a battery monitoring IC (Integrated Circuit) 40 according to the second embodiment of the present invention. It should be noted that the battery monitoring IC 40 in the second embodiment is configured such that a range of an input voltage upon inputting the source voltage VG into the ADC 14 can be improved as compared with the battery monitoring IC 10 in the first embodiment.

As shown in FIG. 2, in addition to the configuration of the battery monitoring IC 10 in the first embodiment, the battery monitoring IC 40 further includes voltage dividing resistors RA and RB connected to the output of the voltage generation circuit 12. A connecting point between the voltage dividing resistors RA and RB is connected to the ADC 14 through the switch SW3. Other components of the battery monitoring IC 40 similar to that of the battery monitoring IC 10 are designated with the same reference numerals, and explanations thereof are omitted.

In the second embodiment, instead of measuring the source voltage VG, the ADC 14 is configured to measure a divided voltage value VG' of the source voltage VG divided with the voltage dividing resistors RA and RB. The divided voltage value VG' is expressed as the equation (2) using the source voltage VG:

$$VG' = \frac{RB \cdot VG}{RA + RB} \quad (2)$$

In the second embodiment, after the divided voltage value VG' is measured, the battery monitoring IC 40 stores the divided voltage value VG' as well as the thermistor voltage VT in the resistor 20. It should be noted that the source voltage VG can be obtained through the equation (3) that is modified from the equation (2):

$$VG = \frac{(RA + RB) \cdot VG'}{RB} \quad (3)$$

In the second embodiment, after the MPU retrieves the divided voltage value VG' and the thermistor voltage VT thus measured from the resistor 20, the MPU converts the divided voltage value VG' into the source voltage VG through the equation (3). Accordingly, the MPU is capable of calculating the temperature TB of the battery Bat.

As described above, in the second embodiment, the battery monitoring IC 40 includes the voltage dividing resistors RA and RB, so that the reference voltage Vr is sufficiently decreased to a low level to be input into the ADC 14. Accordingly, when the source voltage VG as the output voltage of the voltage generation circuit 12 has a voltage value approximately equal to the reference voltage Vr of the ADC 14, it is possible to provide the battery monitoring IC 10 as the semiconductor device, the battery monitoring system having the semiconductor device, and the method of monitoring the battery Bat capable of accurately measuring the temperature of the battery Bat with the simple configuration.

In the first embodiment and the second embodiment, the source voltage VG is applied to the voltage dividing resistor R1, and the thermistor TH is connected to ground, and the present invention is not limited to this configuration. Alternatively, it may be configured such that the source voltage VG is applied to the thermistor TH, and the voltage dividing resistor R1 is connected to ground.

Further, in the first embodiment and the second embodiment, the source voltage VG and the thermistor voltage VT are measured once each, and the present invention is not limited to this configuration. Alternatively, it may be configured such that at least one of the source voltage VG and the thermistor voltage VT is measured at a plurality of times. In particular, for example, the source voltage VG may be measured twice. More specifically, after the source voltage VG is measured, the thermistor voltage VT is measured, and then the source voltage VG is measured one more time. In this case, the resistor 20 may be configured to store three measurement values of the source voltage VG and the thermistor voltage VT. The MPU connected externally calculates an average value of two measurement values of the source voltage VG, and inputs the average value to the equation (1), so that the temperature TB of the battery Bat. Accordingly, an error between the source voltage VG and the thermistor voltage VT due to a difference in the measurement timings can be minimized. Further, it is possible to reduce an influence of a noise unexpectedly generated in the source voltage VG, thereby improving the measurement accuracy.

Third Embodiment

Figure 4:
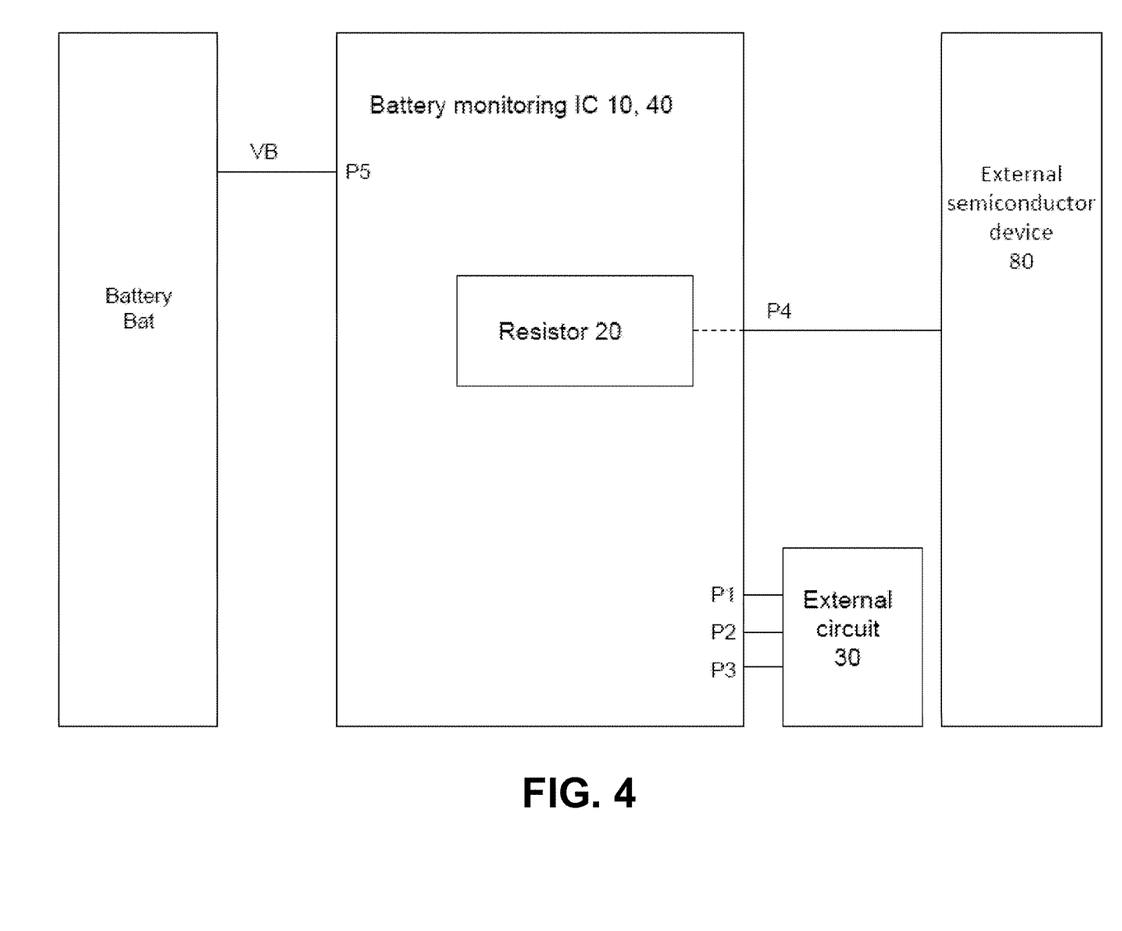
FIG. 4 is a block diagram showing a battery monitoring system according to a third embodiment of the present invention.

A third embodiment of the present invention will be explained next. FIG. 4 is a block diagram showing a battery monitoring system according to the third embodiment of the present invention.

As shown in FIG. 4, the battery monitoring system includes the battery monitoring IC 10 or 40 in the first embodiment or the second embodiment. The battery monitoring system further includes the battery Bat as the monitoring subject; the external circuit 30; and an external semiconductor device 80 such as an MPU (Micro Processing Unit).

In the third embodiment, the battery monitoring IC 10 or 40 is configured to detect and monitor the voltage, the temperature, and the like of the battery Bat as the monitoring subject. Further, the battery monitoring IC 10 or 40 is connected to the external semiconductor device 80 such as an MPU (Micro Processing Unit) to constitute the battery monitoring system. After the measurement values of the source voltage VG, the thermistor voltage VT, and the voltage VB of the battery Bat are stored in the resistor 20, it is possible to retrieve the measurement values from the external semiconductor device 80 connected to the battery monitoring IC 10 or 40.

The disclosure of Japanese Patent Application No. 2014-145250, filed on Jul. 15, 2014, is incorporated in the application by reference.

While the invention has been explained with reference to the specific embodiments of the invention, the explanation is illustrative and the invention is limited only by the appended claims.

What is claimed is:

1. A semiconductor device, comprising:
a voltage generation circuit configured to generate a voltage having a specific voltage value;
a first terminal connected to the voltage generation circuit and configured to output the voltage generated with the voltage generation circuit;
a second terminal connected to the first terminal through a connecting point between a temperature sensitive element and a resistor of a circuit for detecting a temperature of a subject, in which the temperature sensitive element is connected to the resistor in series, said second terminal being configured to receive a temperature sensitive voltage as a voltage at the connecting point;
an analog/digital conversion circuit configured to convert the specific voltage value and a voltage value of the temperature sensitive voltage that are analog values to digital values, respectively, so that the specific voltage value and the voltage value of the temperature sensitive voltage are measured;
a storage unit configured to store the specific voltage value and the voltage value of the temperature sensitive voltage thus measured with the analog/digital conversion circuit so that an external semiconductor device calculates the temperature of the subject; and
a third terminal configured to transmit the specific voltage value and the voltage value of the temperature sensitive voltage thus stored in the storage unit to the external semiconductor device.

2. The semiconductor device according to claim 1, wherein said voltage generation circuit is configured to generate a reference voltage so that the analog/digital conversion circuit converts the specific voltage value and the voltage value of the temperature sensitive voltage to the digital values according to the reference voltage generated with the voltage generation circuit.

3. The semiconductor device according to claim 1, wherein said second terminal is configured to receive the temperature sensitive voltage for detecting a temperature of a rechargeable battery as the subject.

4. The semiconductor device according to claim 3, further comprising a fourth terminal configured to receive a voltage generated with the rechargeable battery.

5. The semiconductor device according to claim 4, further comprising:
a first switch connected between the voltage generation circuit and the analog/digital conversion circuit;
a second switch connected between the second terminal and the analog/digital conversion circuit;
a third switch connected between the fourth terminal and the analog/digital conversion circuit; and
a control circuit configured to control the first switch, the second switch, and the third switch.

6. The semiconductor device according to claim 1, further comprising a switch circuit for switching the first potential and the second potential according to one single switching signal.

7. A battery monitoring system, comprising:
said semiconductor device according to claim 3; and
said external semiconductor device that receives the specific voltage value and the voltage value of the temperature sensitive voltage stored in the storage unit through the third terminal so that the external semiconductor device calculates a temperature of the rechargeable battery according to a specific equation with the specific voltage value and the voltage value of the temperature sensitive voltage as variables.

8. A semiconductor device, comprising:
a voltage generation circuit;
a first terminal connected to the voltage generation circuit;
a second terminal;
a third terminal;
a first switch;

a second switch; and
an analog/digital conversion circuit connected to the first terminal through the first switch, the second terminal, and a circuit for detecting a temperature of a subject,
wherein said analog/digital conversion circuit is connected to a rechargeable battery through the second switch and the third terminal.

* * * * *